United States Patent
Singh

(12) 
(10) Patent No.: US 6,673,662 B2
(45) Date of Patent: Jan. 6, 2004

(54) EPITAXIAL EDGE TERMINATION FOR SILICON CARBIDE SCHOTTKY DEVICES AND METHODS OF FABRICATING SILICON CARBIDE DEVICES INCORPORATING SAME

(75) Inventor: Ranbir Singh, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/264,135

(22) Filed: Oct. 3, 2002

(65) Prior Publication Data

US 2003/0045045 A1 Mar. 6, 2003

Related U.S. Application Data

(62) Division of application No. 09/723,710, filed on Nov. 28, 2000.

(51) Int. Cl.[7] .............................................. H01L 21/338
(52) U.S. Cl. ........................ 438/167; 438/222; 438/931
(58) Field of Search ................................. 438/167, 222, 438/571, 573, 597, 607, 931

(56) References Cited

U.S. PATENT DOCUMENTS

| 3,047,439 A | 7/1962 | Van Daal et al. |
| 3,121,829 A | 2/1964 | Huizing et al. |
| 3,628,187 A | 12/1971 | DeLoach, Jr. et al. ....... 331/107 |
| 4,096,622 A | 6/1978 | MacIver ...................... 29/578 |
| 4,329,699 A | 5/1982 | Ishihara et al. ................. 357/2 |
| 4,607,270 A | 8/1986 | Iesaka .......................... 357/15 |
| 4,638,551 A | 1/1987 | Einthoven .................... 29/571 |
| 4,720,734 A | 1/1988 | Amemiya et al. ............. 357/15 |
| 4,738,937 A | 4/1988 | Parsons ...................... 437/180 |
| 4,742,377 A | 5/1988 | Einthoven .................... 357/15 |
| 4,762,806 A | 8/1988 | Suzuki et al. ................ 437/100 |
| 4,765,845 A | 8/1988 | Takada et al. ............... 136/258 |

(List continued on next page.)

FOREIGN PATENT DOCUMENTS

| EP | 1111688 A1 | 6/2001 |
| JP | 58-148469 | 3/1983 |
| JP | 62-279672 | 6/1988 |
| JP | 63-133569 | 6/1988 |
| WO | WO 96/03774 | 2/1996 |
| WO | WO97/08754 | 3/1997 |

OTHER PUBLICATIONS

Katsunori Ueno, Tatsue Urushidani, Kouichi Hahimoto, and Yasukazu Seki. "The Guard –Ring Termination for the High–Voltage SiC Schottky Barrier Diodes." *IEEE Electron Device Letters.* vol. 16. No. 7, Jul. 1995.

(List continued on next page.)

*Primary Examiner*—Phuc T. Dang
(74) *Attorney, Agent, or Firm*—Myers Bigel Sibley & Sajovec, P.A.

(57) ABSTRACT

Edge termination for a silicon carbide Schottky rectifier is provided by including a silicon carbide epitaxial region on a voltage blocking layer of the Schottky rectifier and adjacent a Schottky contact of the silicon carbide Schottky rectifier. The silicon carbide epitaxial layer may have a thickness and a doping level so as to provide a charge in the silicon carbide epitaxial region based on the surface doping of the blocking layer. The silicon carbide epitaxial region may form a non-ohmic contact with the Schottky contact. The silicon carbide epitaxial region may have a width of from about 1.5 to about 5 times the thickness of the blocking layer. Schottky rectifiers with such edge termination and methods of fabricating such edge termination and such rectifiers are also provided. Such methods may also advantageously improve the performance of the resulting devices and may simplify the fabrication process.

19 Claims, 9 Drawing Sheets

U.S. PATENT DOCUMENTS

| | | | | |
|---|---|---|---|---|
| 4,816,879 | A | | 3/1989 | Ellwanger .................... 357/15 |
| 4,866,005 | A | | 9/1989 | Davis et al. ................ 437/100 |
| 4,875,083 | A | | 10/1989 | Palmour .................... 357/23.6 |
| 4,901,120 | A | | 2/1990 | Weaver et al. ................ 357/15 |
| 4,907,040 | A | | 3/1990 | Kobayashi et al. ............ 357/4 |
| 4,918,497 | A | | 4/1990 | Edmond ...................... 357/17 |
| 5,471,072 | A | | 11/1995 | Papanicolaou ............... 257/77 |
| 5,712,502 | A | | 1/1998 | Mitlehner ................... 257/341 |
| 5,789,311 | A | | 8/1998 | Ueno et al. ................. 438/573 |
| 5,801,836 | A | | 9/1998 | Bakowski et al. .......... 257/487 |
| 5,907,179 | A | | 5/1999 | Losehand et al. ........... 257/475 |
| 5,914,500 | A | | 6/1999 | Bakowski et al. ............ 257/77 |
| 5,932,894 | A | | 8/1999 | Bakowski et al. ............ 257/76 |
| 5,977,605 | A | | 11/1999 | Bakowsky et al. ......... 257/496 |
| 6,002,159 | A | | 12/1999 | Bakowski et al. .......... 257/493 |
| 6,005,261 | A | | 12/1999 | Konstantinov ............... 257/77 |
| 6,040,237 | A | | 3/2000 | Bakowski et al. .......... 438/521 |
| 6,083,814 | A | | 7/2000 | Nilsson et al. .............. 438/519 |
| 6,110,813 | A | * | 8/2000 | Ota et al. |
| 6,191,015 | B1 | | 2/2001 | Losehand et al. ........... 438/570 |
| 6,313,482 | B1 | | 11/2001 | Baliga ......................... 257/77 |
| 6,320,205 | B1 | | 11/2001 | Pfirsch et al. ................. 257/77 |

OTHER PUBLICATIONS

Singh, R. and J.W. Palmour, "Planar Terminations in 4H–SiC Schottky Diodes with Low Leakage and High Yields," *IEEE International Symposium on Power Semiconductor Devices and ICs*, 1997.

Kosiachenko, L.A. and E.F. Kukhta, V.M. Skiliarchuk, "Light Emission from Metal at Forward Bias of a Shottky Diode," *Zhurnal tekhnicheskoi fiziki [Journal of Technical Physics]*, vol. 54, No. 6, 1984.

Kyoritsu Shuppan Kabushiki Kaisha, *Crystallography Handbook*.

*The Electrical Engineering Handbook*, Richard C. Dorf, editor, Second Edition, CRC/IEEE Press.

Sze, S.M. *Physics of Semiconductor Devices*, John Wiley & Sons, p. 250–254.

Streetman, B.G. *Solid State Electronic Devices*. Second Edition, Prentice–Hall, 1980, pp. 192–193, 201, 443.

Saidov, M.S., Kh. A. Shamuratov, and A. Umurzakov. "Current–voltage characteristics of silicon carbide heterojunctions." *Soviet Physics of Semiconductors*. vol. 13, No. 9, Sep., 1979, pp. 1054–1056.

Pelletier, J., D. Gervais, and C. Pomot. "Application of Wide Gap Semiconductors to Surface Ionization: Work Functions of AlN and SiC Crystals." *Journal of Applied Physics*. vol. 55, No. 4. Feb. 15, 1984, pp. 994–1002.

Edmond, J.A., J. Ryu, J.T. Glass, and R.F. Davis. "Electrical Contacts to Beta Silicon Carbide Thin Films." *Journal of the Electromechanical Society*. vol. 135, No. 2, Feb. 1988, pp. 359–362.

Waldrop, J.R. and R.W. Grant. "Formation and Schottky barrier height of metal contacts to $\beta$ –SiC." *Applied Physics Letters*. vol. 56, No. 6, Feb. 5, 1990, pp. 557–559.

Ioannou, D.E. and N.A. Papanicolaou. "Deep Level Transient Spectroscopy of $\beta$ –SiC Layers." *Abstracts*. Fourth National Review Meeting On Growth and Characterization of SiC and Its Employment in Semiconductor Applications.

Anikin, M.M. et al. "Electrostatic properties of SiC–6H structures with an abrupt pin junction," *Soviet Physics Semiconductors*. Jan. 1988, vol. 22(1): pp. 80–83.

Glover, G.H. "Charge Multiplication in Au–SiC (6H) Schottky Junctions." *Journal of Applied Physics*. Nov., 1975, vol. 46, No. 11: pp. 4842–4844.

Ioannou et al. "The Effect of Heat Treatment of Au Schottky Contacts on $\beta$ –SiC." *IEEE Transactions of Electron Devices*. Aug., 1979, vol. Ed–34, No. 8: pp. 1694–1699.

Violin, E.E., et al. "Light Emitting Devices Based on Silicon Carbide." *Silicon Carbide*. 1973, p. 565. (edited by Marshall, Faust, Ryan).

Powell, J.A. "Silicon Carbide: Progress in Crystal Growth." *Material Reserach Society Symposium Proceedings*. 1987, vol. 97: pp. 159–168.

Konstantinov, A.O. "Ionization Rates and Critical Fields in 4H Silicon Carbide," *Appl. Phys. Lett*. vol. 71, No. 1, Jul. 1997, pp. 90–92.

International Search Report, PCT/US01/47924, Sep. 5, 2002.

* cited by examiner

EPITAXIAL EDGE TERMINATION FOR SILICON CARBIDE SCHOTTKY DEVICES AND METHODS OF FABRICATING SILICON CARBIDE DEVICES INCORPORATING SAME

This application is a divisional application of co-pending U.S. application Ser. No. 09/723,710, filed on Nov. 28, 2000, the disclosure of which is incorporated by reference herein in its entirety.

FIELD OF THE INVENTION

The present invention relates microelectronic devices and more particularly to edge termination for silicon carbide Schottky devices.

BACKGROUND OF THE INVENTION

High voltage silicon carbide (SiC) Schottky diodes, which can handle voltages between 600V and 2.5 kV, are expected to compete with silicon PIN diodes fabricated of similar voltage ratings. Such diodes may handle as much as 100 amps of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based devices are theoretically capable of much highe in excess of 100 times better than silicon. In addition, silicon carbide devices may be capable of handling a higher current density than silicon devices.

However, reliable fabrication of silicon carbide-based Schottky devices may be difficult. Typical edge termination in SiC Schottky diodes require ion implantation of p-type dopants into the crystal. Such implants may cause substantial damage to the crystal lattice, which may require high temperature annealing to repair such defects. This high-temperature anneal step (>1500° C.) may be undesirable for a number of reasons. For example, high temperature anneals tend to degrade the surface of SiC on which the Schottky contact is to be made, as silicon tends to dissociate from exposed surfaces of the crystal under such a high-temperature anneal. Loss of silicon in this manner may result in a reduced quality Schottky contact between metal and the semiconductor surface. High temperature anneals have other drawbacks as well. Namely, they are typically time-consuming and expensive. Moreover, implantation of p-type (Al) dopants may cause substantial lattice damage, while other species (B) have poor activation rates.

A conventional SiC Schottky diode structure has an n-type SiC substrate on which an n⁻ epitaxial layer, which functions as a drift region, is formed. The device typically includes a Schottky contact formed directly on the n⁻ layer. Surrounding the Schottky contact is a p-type JTE (junction termination extension) region which is typically formed by ion implantation. The implants may be aluminum, boron, or any other suitable p-type dopant. The purpose of the JTE region is to prevent the electric field crowding at the edges, and to prevent the depletion region from interacting with the surface of the device. Surface effects may cause the depletion region to spread unevenly, which may adversely affect the breakdown voltage of the device. Other termination techniques include guard rings and floating field rings which are more strongly influenced by surface effects. A channel stop region may also be formed by implantation of n-type dopants such as Nitrogen or Phosphorus in order to prevent the depletion region from extending to the edge of the device.

Additional conventional termination of SiC Schottky diodes are described in "Planar Terminations in 4H—SiC Schottky Diodes With Low Leakage And High Yields" by Singh et al., ISPSD '97, pp. 157–160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331–332. Additionally, other termination techniques are described in published PCT Application No. WO 97/08754 entitled "SiC Semiconductor Device Comprising A PN Junction With A Voltage Absorbing Edge."

SUMMARY OF THE INVENTION

Embodiments of the present invention may provide a silicon carbide Schottky rectifier having a silicon carbide voltage blocking layer having a predefined surface doping level and a Schottky contact on the silicon carbide voltage blocking layer. A silicon carbide epitaxial region is also provided on the silicon carbide voltage blocking layer and adjacent the Schottky contact. The silicon carbide epitaxial region has a thickness and a doping level designed to provide a selected charge per unit area in the silicon carbide epitaxial region. The charge per unit area in the silicon carbide epitaxial regions, also referred to as the junction termination extension (JTE) charge, is selected based on the surface doping of the blocking layer. In particular embodiments, the JTE charge is greater than 50% of an optimal JTE charge as determined by the surface doping of the blocking layer. Furthermore, it is preferred that the JTE charge is not greater than the optimal charge value.

In further embodiments of the present invention, a silicon carbide Schottky rectifier is provided having a silicon carbide voltage blocking layer and a Schottky contact on the silicon carbide voltage blocking layer. A silicon carbide epitaxial termination region is provided on the voltage blocking layer and adjacent the Schottky contact. The product of the thickness and doping concentration of the silicon carbide epitaxial region is greater than about 50% of $$\frac{(\varepsilon_r \times \varepsilon_0 \times E_C)}{q};$$

where:

$\varepsilon_r$ is the relative dielectric constant of SiC;

$\varepsilon_0$ so is dielectric constant of air;

$E_C$ is the critical electric field of SiC; and q is the electronic charge.

In further embodiments, the product of the thickness and doping concentration are not greater than about 100% of $$\frac{(\varepsilon_r \times \varepsilon_0 \times E_C)}{q}.$$

In still further embodiments, the thickness and doping concentration are not less than about 75% of $$\frac{(\varepsilon_r \times \varepsilon_0 \times E_C)}{q}.$$

In still further embodiments of the present invention, the silicon carbide epitaxial region extends from the Schottky contact from about 1.5 to about 5 times the thickness of the blocking layer. Additionally, a non-ohmic contact may be provided between the silicon carbide epitaxial termination region and the Schottky contact.

In embodiments of the present invention where the silicon carbide epitaxial region has a first conductivity type and the voltage blocking layer has a second conductivity type opposite the first conductivity type, the edge termination may also include a region of first conductivity type silicon carbide in the voltage blocking layer having a carrier concentration higher than that of the voltage blocking layer and adjacent a periphery of the silicon carbide epitaxial region opposite the Schottky contact.

In additional embodiments of the present invention, the Schottky rectifier may also include a first layer of silicon carbide of a first conductivity type the same as a conductivity type of the blocking layer and disposed between the blocking layer and a silicon carbide substrate. The first layer of silicon carbide may have a carrier concentration higher than the blocking layer. A second layer of silicon carbide of the first conductivity type may also be provided on the substrate opposite the first layer of silicon carbide so as to provide a layer of silicon carbide having a carrier concentration higher than a carrier concentration of the substrate. An ohmic contact may be provided on the second layer of silicon carbide. In such embodiments, the second layer may be an implanted layer of first conductivity type silicon carbide. Furthermore, the silicon carbide epitaxial region may be of a second conductivity type opposite that of the first conductivity type. In particular, the first conductivity type may be n-type and the second conductivity type may be p-type.

In other embodiments of the present invention, a Schottky rectifier is provided which includes an n-type silicon carbide substrate, an n-type silicon carbide blocking layer on the silicon carbide substrate, a Schottky contact on the silicon carbide blocking layer, an epitaxial region of p-type silicon carbide on the silicon carbide blocking layer and adjacent the Schottky contact so as to form a non-ohmic contact between the p-type epitaxial region and the Schottky contact, and an ohmic contact on the substrate opposite the blocking layer.

In further embodiments of the present invention, a plurality of p-type silicon carbide islands on the blocking layer may be provided. In such embodiments, the Schottky contact overlaps the plurality of p-type islands.

In yet other embodiments of the present invention, a Schottky rectifier is provided which includes an n-type silicon carbide substrate, an n-type silicon carbide blocking layer on the silicon carbide substrate, a Schottky contact on the silicon carbide blocking layer, an epitaxial region of p-type silicon carbide on the silicon carbide blocking layer and adjacent the Schottky contact so as to form a non-ohmic contact between the p-type epitaxial region and the Schottky contact and an ohmic contact on the substrate opposite the blocking layer. The p-type silicon carbide epitaxial region extends from the Schottky from contact about 2 to about 3 times the thickness of the blocking layer. Such embodiments may also include a plurality of p-type silicon carbide islands on the blocking layer. If so, then the Schottky contact overlaps the plurality of p-type islands.

In method embodiments of the present invention, a method of fabricating a termination region of a silicon carbide Schottky rectifier includes forming an epitaxial layer of p-type silicon carbide having a thickness and a doping level selected so as to provide a charge in a region of p-type silicon carbide adjacent to a Schottky contact of the Schottky rectifier proportional to the surface doping of a silicon carbide blocking layer of the Schottky rectifier and patterning the epitaxial layer of p-type silicon carbide so as to provide the region of p-type silicon carbide adjacent to the Schottky contact of the Schottky rectifier.

In such method embodiments, the patterning the epitaxial layer of p-type silicon carbide may be provided by forming an oxide layer on the p-type epitaxial layer of silicon carbide, patterning the oxide layer so as to expose a portion of the p-type epitaxial layer corresponding to the Schottky contact, thermally oxidizing the exposed portion of the p-type epitaxial layer at a temperature and for a time sufficient to consume all of the expose portion of the p-type epitaxial layer, and etching the thermally oxidized portion of the p-type epitaxial layer so as to expose a portion of the blocking layer on which the Schottky contact is formed. Furthermore, thermally oxidizing the p-type epitaxial layer may be carried out in a dry ambient environment. Additionally, thermally oxidizing the p-type epitaxial layer may be accomplished by oxidizing the p-type epitaxial layer at a temperature of less than about 1300° C.

In further embodiments, etching the thermally oxidized portion of the p-type epitaxial layer may be preceded depositing an ohmic metal on a surface of a silicon carbide substrate opposite the blocking layer and annealing the ohmic metal so as to form an ohmic contact to the silicon carbide substrate. Such a deposition of an ohmic metal may also be preceded by implanting n-type dopants in the substrate so as to form a region of n-type silicon carbide having a carrier concentration higher than a carrier concentration of the substrate. In such embodiments, the ohmic metal may be deposited on the implanted region of the substrate. Furthermore, the implantation of n-type dopants may be carried out prior to thermally oxidizing the exposed portion of the p-type epitaxial layer such that thermally oxidizing the exposed portion of the p-type epitaxial layer also activates the n-type dopants.

In yet other embodiments of the present invention, etching the thermally oxidized portion of the p-type epitaxial layer is followed by depositing a Schottky metal on the exposed portion of the blocking layer.

In still other embodiments of the present invention, the good quality passivating oxide layer is patterned so as to expose a portion of the p-type epitaxial layer corresponding to the Schottky contact including a plurality of regions of exposed portions of the p-type epitaxial layer. The exposed portion of the p-type epitaxial layer including the plurality of regions is thermally oxidized at a temperature and for a time sufficient to consume all of the exposed portion of the p-type epitaxial layer. The thermally oxidized portion of the p-type epitaxial layer is etched so as to expose a portion of the blocking layer on which the Schottky contact is formed thereby providing a plurality of exposed portions of the blocking layer spaced apart by islands of p-type silicon carbide.

In additional embodiments of the present invention, patterning the oxide layer so as to expose a portion of the p-type epitaxial layer corresponding to the Schottky contact is preceded by patterning the oxide layer and the p-type epitaxial layer to expose a portion of the blocking layer at the periphery of the Schottky rectifier, and implanting n-type dopants in the exposed portion of the n-type blocking layer so as to provide a region of implanted n-type dopants adjacent the periphery of the p-type epitaxial layer.

In particular embodiments, the thickness and doping level of the silicon carbide epitaxial region are selected so as to provide a charge in the region of p-type silicon carbide adjacent to a Schottky contact of the Schottky rectifier which is from about 50% to about 100% of $$Q_{JTE,opt} = \frac{(\varepsilon_r \times \varepsilon_0 \times E_C)}{q};$$

where:

$Q_{JTE,opt}$ is the optimum JTE charge;
$\varepsilon_r$ is the relative dielectric constant of SiC;
$\varepsilon_0$ is dielectric const. of air;
$E_C$ is the critical electric field of SiC; and
q is the electronic charge.

Furthermore, the thickness and doping level may be about 75% of $$Q_{JTE,opt} = \frac{(\varepsilon_r \times \varepsilon_0 \times E_C)}{q}.$$

In further method embodiments of the present invention, a method of fabricating a silicon carbide Schottky rectifier is provided by forming a first n-type silicon carbide epitaxial layer on an n-type silicon carbide substrate, wherein the first n-type silicon carbide epitaxial layer has a carrier concentration less than a carrier concentration of the silicon carbide substrate. A p-type silicon carbide epitaxial layer is formed on the first n-type epitaxial layer. A passivating oxide is deposited on the p-type silicon carbide epitaxial layer and the passivating oxide patterned to expose a portion of the p-type silicon carbide corresponding to a Schottky contact of the Schottky rectifier. The exposed portion of the p-type silicon carbide is thermally oxidized to oxidize the p-type silicon carbide to the first n-type epitaxial layer. An ohmic contact metal is then deposited on the substrate opposite the first n-type epitaxial layer and annealed so as to provide an ohmic contact to the substrate. Then the oxidized p-type silicon carbide is removed to expose a portion of the first n-type epitaxial layer corresponding to the Schottky contact and a Schottky metal deposited on the exposed portion of the first n-type epitaxial layer so as to provide a Schottky contact to the first n-type epitaxial layer.

In further embodiments of the present invention, the p-type silicon carbide epitaxial layer has a thickness and a doping level selected so as to provide a charge in a region of p-type silicon carbide adjacent to the Schottky contact of the Schottky rectifier proportional to the surface doping of the first n-type epitaxial layer.

In other embodiments, the method further includes forming a second layer of n-type silicon carbide, wherein the second layer of n-type silicon carbide is disposed between the silicon carbide substrate and the first n-type epitaxial layer and has a carrier concentration higher than the carrier concentration of the silicon carbide substrate.

In still other embodiments, the method may also include patterning the p-type epitaxial layer to expose a portion of the first n-type epitaxial layer adjacent the periphery of the Schottky rectifier, implanting n-type dopants in the exposed portion of the first n-type epitaxial layer and thermally annealing the implanted dopants so as to activate the dopants. In such embodiments, the deposition of a passivating oxide may also include depositing a passivating oxide on the p-type epitaxial layer and the implanted region of the first n-type epitaxial layer. In particular embodiments, the thermal anneal of the implanted dopants is carried out at a temperature of less than about 1300° C.

Furthermore, additional method embodiments may also include implanting n-type dopants in the silicon carbide substrate opposite the first n-type epitaxial layer so as to provide a region of n-type silicon carbide having a carrier concentration higher than the carrier concentration of the silicon carbide substrate. In such embodiments, implanting n-type dopants may be followed by depositing an oxide on the implanted region of the silicon carbide substrate and the thermal oxidation step may be followed by removing the oxide from the implanted region of the silicon carbide substrate.

The advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention will now be described with reference to the Figures which illustrate various embodiment of the present invention. As illustrated in the Figures, the sizes of layers or regions are exaggerated for illustrative purposes and, thus, are provided to illustrate the general structures or the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate. Like numbers refer to like elements throughout.

As is described in more detail below, embodiments of the present invention may provide improved Schottky rectifiers by providing p-type edge termination without the need for a p-type implant. The avoidance of a p-type implant may also avoid the need for a high temperature anneal which may adversely effect the characteristics of the device. As certain embodiments of the present invention utilize only n-type implants of, for example, Phosphorous which may be annealed at less than 1300° C., for example, 1200° C., or Nitrogen which may be annealed at about 1500° C., the higher temperatures needed to activate p-type implants may be avoided.

Furthermore, as is described in further detail below, because the p-type termination region is formed in an epitaxial process, its doping and thickness may be closely controlled. Thus, the use of an epitaxial p-type edge termination may allow for selecting a charge in the edge termination based on the surface charge of the voltage blocking layer which may provide improved edge termination performance over, for example, relatively uncontrolled epitaxial edge termination or implanted edge termination techniques.

In embodiments of the present invention it may also be possible to form the Schottky contact on a region of SiC which has not been exposed to ambient when a high temperature (e.g. >1500° C.) anneal is performed and, thus, loss of Si during the anneal may be reduced or avoided. Accordingly, a higher quality Schottky contact may be provided.

Figure 1:
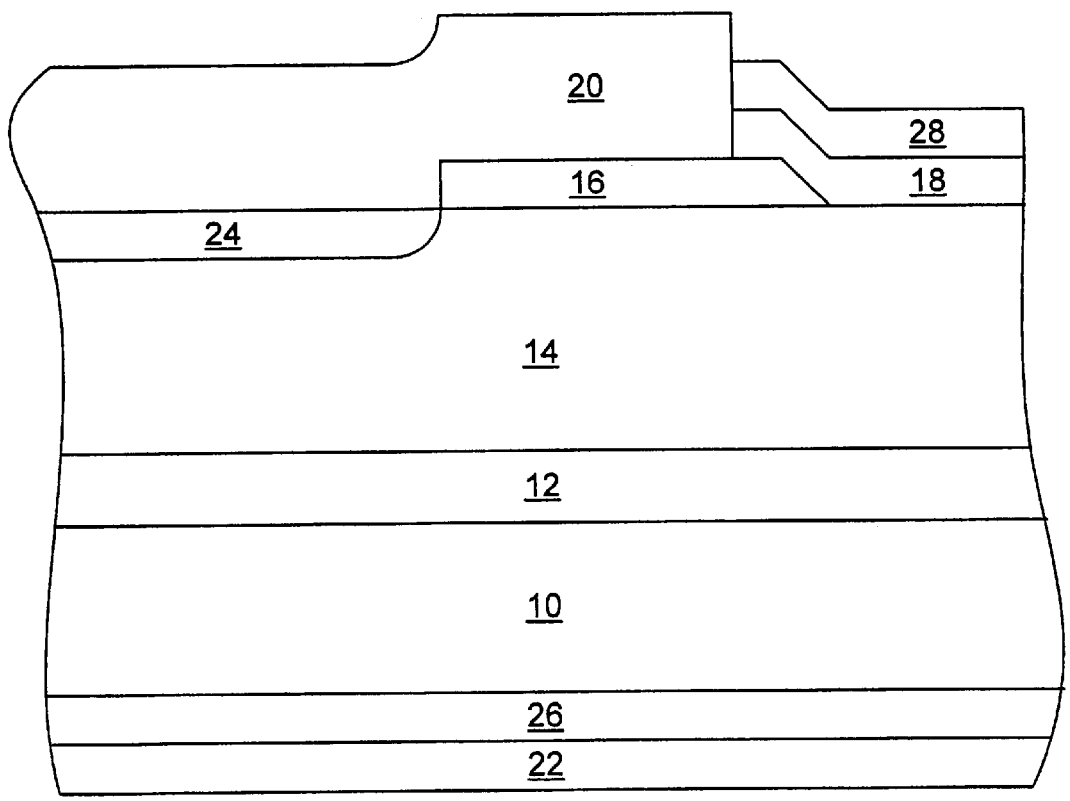
FIG. 1 is a cross-sectional view of one embodiment of a Schottky rectifier having edge termination according to embodiments of the present invention.

FIG. 1 illustrates a first embodiment of a Schottky rectifier having epitaxial edge termination according to the present invention. A first (optional) epitaxial layer 12 of n-type conductivity is grown on a single crystal bulk silicon carbide substrate 10 of n-type conductivity and may act as a buffer layer. The first epitaxial layer of silicon carbide 12 is disposed between the substrate 10 and an n-type epitaxial layer 14 which may provide a voltage blocking layer. The silicon carbide substrate 10 may be an n$^+$ SiC substrate, the first epitaxial layer 12 may be a highly doped n-type SiC epitaxial layer and the n-type epitaxial layer 14 may be a lightly doped n-type SiC epitaxial layer. Thus, the first epitaxial layer 12 may have a carrier concentration comparable to the silicon carbide substrate 10 and the n-type epitaxial layer 14 may have a lower carrier concentration than the silicon carbide substrate 10. A Schottky contact 18 is also provided on the n-type epitaxial layer 14.

A p-type silicon carbide epitaxial termination region 16 is also provided. The p-type epitaxial termination region 16 is provided on the n-type epitaxial layer 14 and is adjacent the Schottky contact 18. A passivating oxide 20 may also be provided. The passivating oxide 20 may cover exposed areas of the Schottky rectifier other than the Schottky contact 18. Furthermore, an ohmic contact 22 may also be provided on the substrate 10 opposite the Schottky contact 18. The ohmic contact 22 may be provided on an optional n$^+$ region of silicon carbide 26 which may be provided by implantation in the substrate 10 and/or as an epitaxial layer formed on the substrate 10. Preferably, the p-type epitaxial termination region 16 extends from the Schottky contact 18 a distance from about 2 to about 3 times the thickness of the n-type epitaxial layer 14. The silicon carbide substrate and epitaxial layers may be 4H SiC.

FIG. 1 also illustrates an optional n$^+$ region of silicon carbide 24 in the n-type voltage blocking layer 14 at the periphery of the p-type epitaxial termination region 16. The n$^+$ region of silicon carbide 24 may provide a "channel stop" region for the Schottky rectifier. An optional metal overlayer 28 on the Schottky metal 18 is also illustrated in FIG. 1.

In particular embodiments of the present invention, the p-type epitaxial termination region 16 has a controlled doping and thickness so as to provide a predefined charge in the p-type epitaxial termination region 16 based on the surface doping of the n-type voltage blocking layer 14. Preferably, the charge in the p-type epitaxial termination region 16 is selected based on a theoretical optimum junction termination extension (JTE) charge given the surface doping concentration of the epitaxial layer used to make this structure:

$$Q_{JTE,act} = \alpha Q_{JTE,opt},$$

where $$Q_{JTE,opt} = \frac{(\varepsilon_r \times \varepsilon_0 \times E_C)}{q};$$

where:
- $\alpha$ is a proportionality value between 0.5 and 1.0;
- $Q_{JTE,opt}$ is the theoretical optimum JTE charge;
- $\varepsilon_r$ is the relative dielectric constant of SiC (which is about 9.7);
- $\varepsilon_0$ is dielectric constant of air which is $8.854 \times 10^{-14}$ C-cm/V;
- $E_C$ is the critical electric field of SiC, which is dependent on the doping by the formula given below;
- q is the electronic charge which is $1.602 \times 10^{-19}$ C; and
- $Q_{JTE,act}$ is the actual selected JTE charge.

The critical electric field of SiC is given by the following equation:

$$E_C = \frac{2.49 \times 10^6}{(1 - 0.25 \times \ln(N/10^{16}))} \text{ V/cm};$$

where N is the doping of the n-type blocking layer. See "Ionization rates and critical fields in 4H—SiC," by A. O. Konstantinov, Q. Wahab, N. Nordell and U. Lindefelt, Applied Physics Letters, vol. 72, No. 1, July 1997.

Figure 3A:
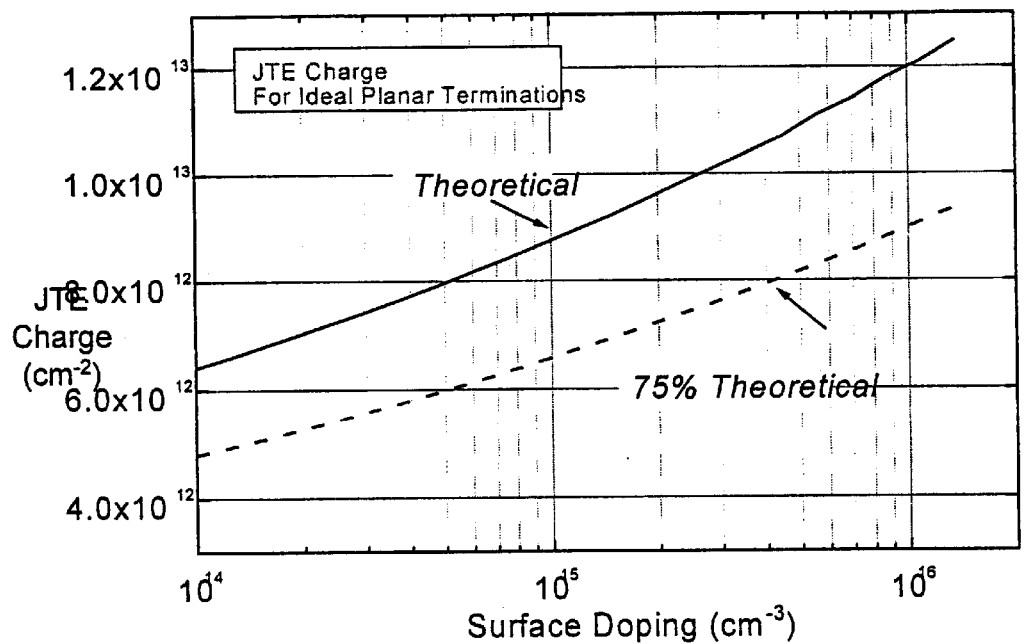
FIG. 3A is a graph illustrating a relationship between the charge in the epitaxial edge termination and the surface doping of a voltage blocking layer on which the epitaxial edge termination is formed.
Figure 3B:
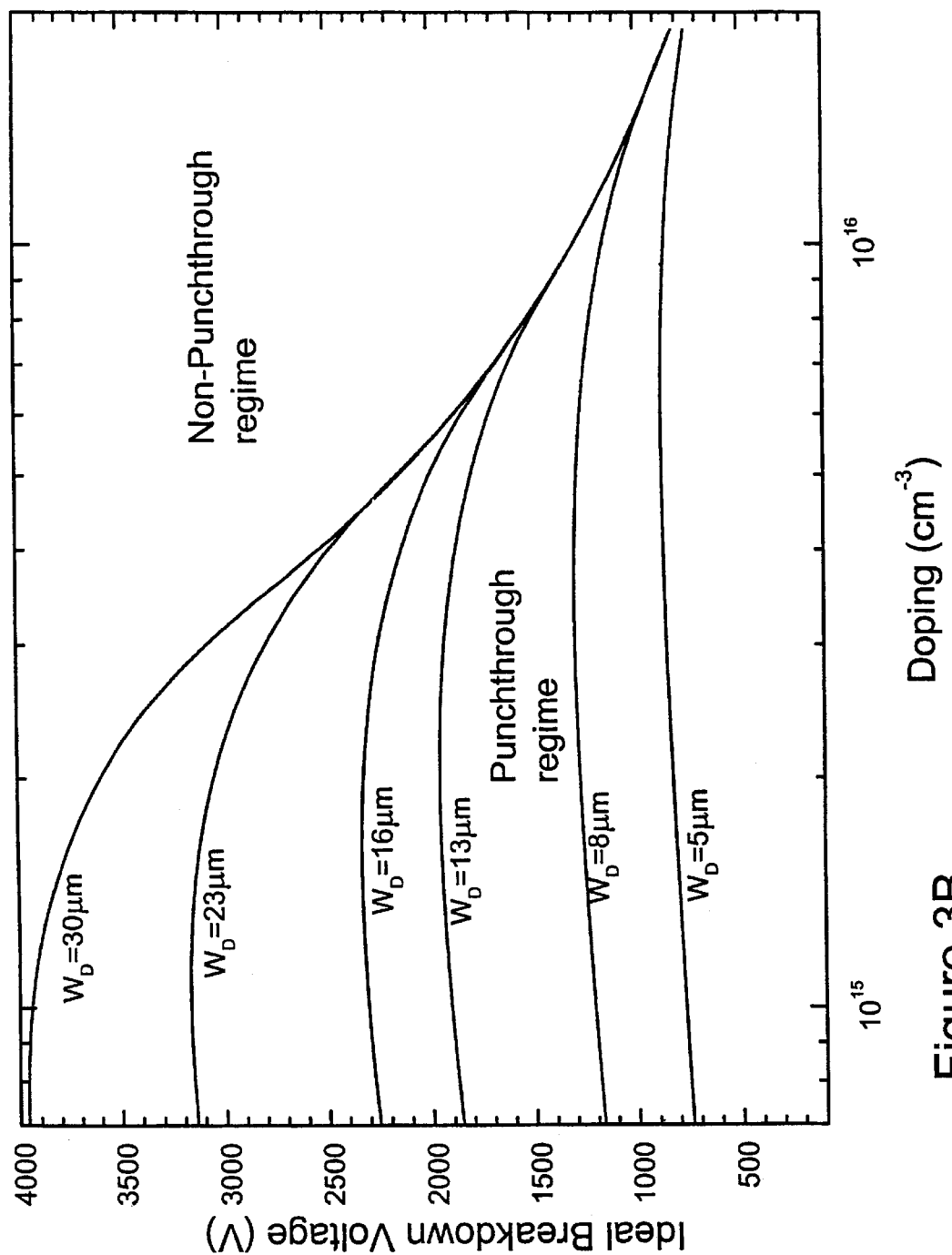
FIG. 3B is a graph illustrating an exemplary relationship of the "ideal" blocking voltage $V_B$ to surface doping $N_D$ in the voltage blocking layer for a range of given thickness $w_D$ of the voltage blocking layer.

An illustration of the relationship of JTE charge to surface doping is seen in FIG. 3A. The line identified as "theoretical" corresponds to an $\alpha$ of 1.0 and the "75% theoretical" line corresponds to an a of 0.75. FIG. 3B shows an exemplary illustration of the relationship of the "ideal" blocking voltage $V_B$ to surface doping $N_D$ in the voltage blocking layer 14 for a range of given thickness $w_D$ of the voltage blocking layer 14. In this context "ideal" refers to the best blocking voltage obtainable for a given layer thickness and doping without regard to surface or other effects. FIG. 3B shows that, as the surface doping $N_D$ in the voltage blocking layer 14 increases, the ideal blocking voltage generally decreases. In general, the ideal blocking voltage $V_B$ may be calculated using the following equation:

$$V_B = \frac{\beta(w_D \times E_C)}{2}$$

where $0.75 \leq \beta \leq 1$ and $E_C$ is given by the equation set forth above. A doping level in the range of $1 \times 10^{15}$ to $2 \times 10^{16}$ may yield a blocking voltage from approximately 2.5 kV at $w_D = 30$ μm to 400 V at $w_D = 4$ μm, provided the doping is selected to be as high as possible while keeping the device in the punch-through regime.

As those of skill in the art will recognize, a diode epitaxial design is said to be in the punch-through regime when the breakdown voltage is primarily a function of the epitaxial thickness of the voltage blocking layer. In contrast, in the non-punch-through regime, the breakdown voltage is primarily a function of doping. For a given epitaxial thickness, whether a diode design is in the punch-through regime or non-punch-through regime depends on the doping of the voltage blocking layer. In general, an empirical relation describing the boundary between the punch-through regime and the non-punch-through regime may be:

$$BV=5.73\times10^{14}N_D^{-0.73}.$$

Figure 3C:
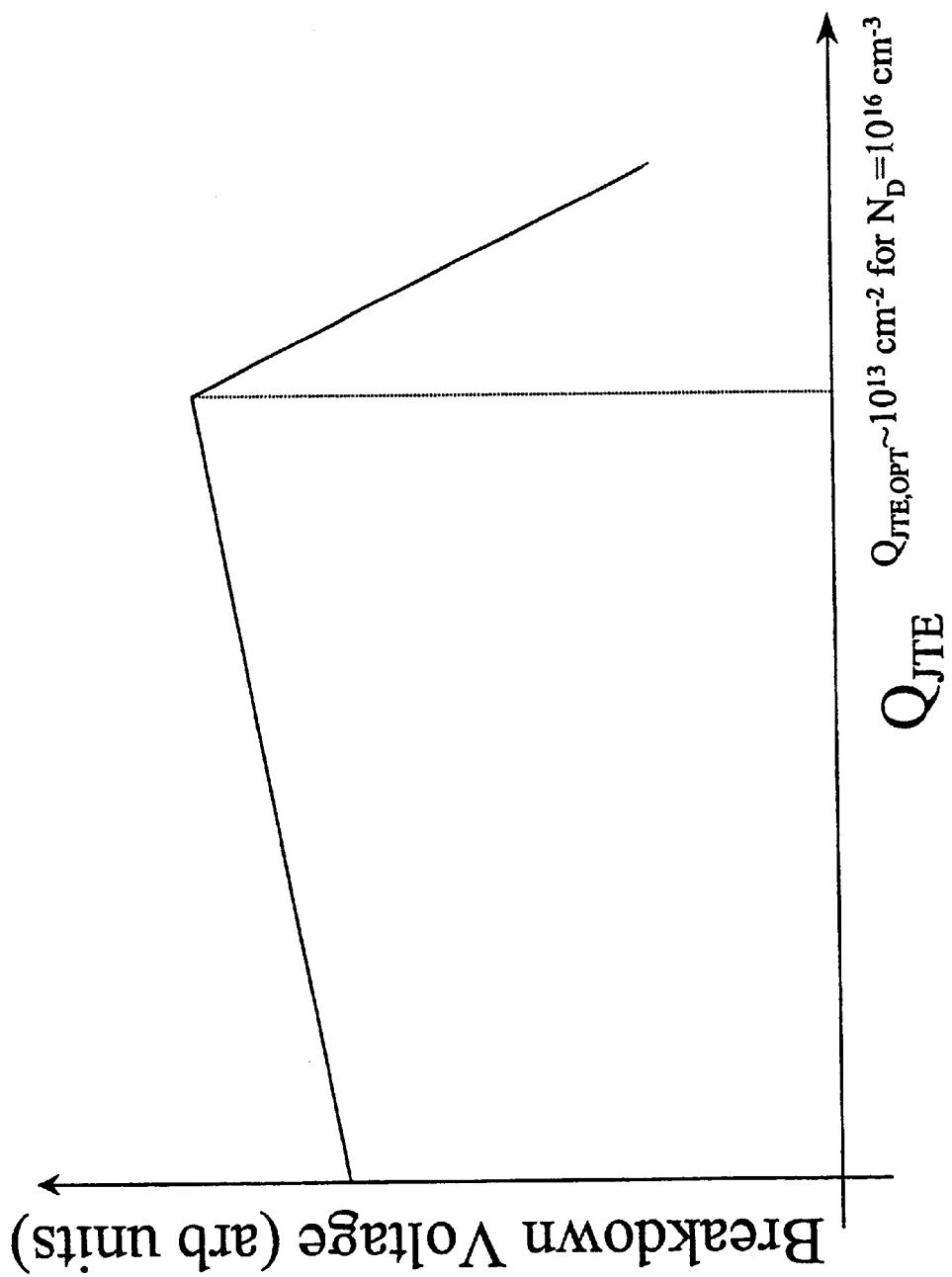
FIG. 3C is a graph illustrating the blocking voltage to JTE charge ($Q_{JTE}$)

An exemplary illustration of the blocking voltage to JTE charge ($Q_{JTE}$) is shown in FIG. 3C. As seen in FIG. 3C, as charge in the JTE increases for a given surface doping of the blocking layer, the breakdown voltage of the device generally increases. However, if surface doping of the blocking layer remains constant and charge increases beyond a threshold value (identified in FIG. 3C as $Q_{JTE,opt}$), the blocking voltage of the device decreases. Furthermore, the absolute value of the slope of the curve of blocking voltage versus JTE charge is substantially greater above the threshold value than below. This maximum point in the blocking voltage versus JTE charge curve is the "theoretical optimum" charge as it is the charge which theoretically provides the maximum breakdown voltage of a device for a give voltage blocking layer surface doping. Because the slope is steeper above the theoretical optimum value, it may be preferable to avoid exceeding the theoretical optimum value. Thus, it is preferable the a value not be substantially greater than 1.0. Furthermore, if a is too small, then the JTE may have only limited effect on the performance of the device. Thus, it is preferred that α be greater than about 0.5. Additionally, because exceeding the optimum charge value may substantially decrease the blocking voltage of the device, it is preferred that variations in the manufacturing process(es) be taken into account in establishing the charge for the JTE. Thus, it may be preferable to utilize an α value of about 0.75 or from about 0.75 to about 1.0. However, as will be appreciated by those of skill in the art in light of the present disclosure, the selection of an α value may depend on the degree of variation in the final products, the acceptable failure rate or other manufacturing concerns.

Figure 2A:
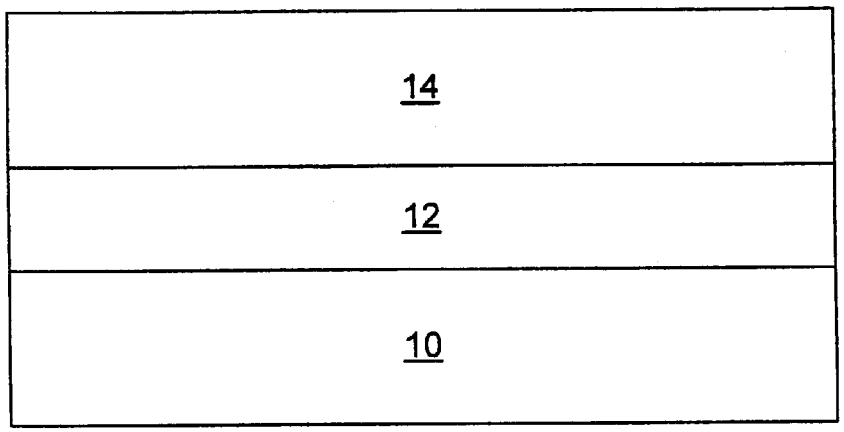
FIGS. 2A through 2I illustrate processing steps for fabricating silicon carbide Schottky rectifiers having edge termination according to embodiments of the present invention.

FIGS. 2A through 2I illustrate processing steps which may be utilized in producing Schottky rectifiers having edge termination according to various embodiments of the present invention. As seen in FIG. 2A, a layer of n+ silicon carbide 12 may optionally be formed on a single crystal silicon carbide substrate 10 by epitaxial growth, ion implantation or other such techniques known to those of skill in the art. An n⁻ epitaxial layer of silicon carbide 14 is formed on the n+ silicon carbide layer 12 if present, or the substrate 10. The n⁻ epitaxial layer 14 may also be formed utilizing techniques known to those of skill in the art.

Figure 2B:
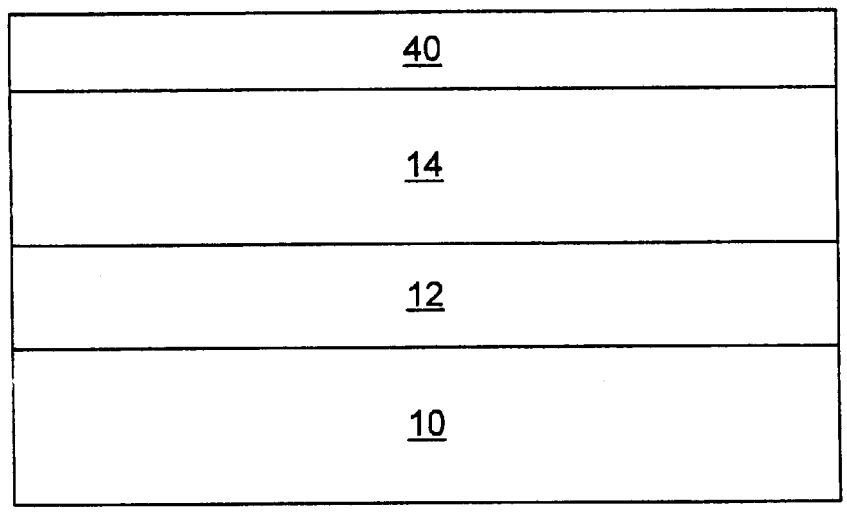

As illustrated in FIG. 2B, a p-type epitaxial layer is formed on the n⁻ epitaxial layer 14 with a doping and depth which are controlled so as to provide the predetermined charge proportional to the surface charge of the n⁻ epitaxial layer 14 as described above. Such a doping and depth may also take into account any loss in the p-type epitaxial layer during subsequent processing so that the final p-type termination region has the proper final total charge.

Figure 2C:
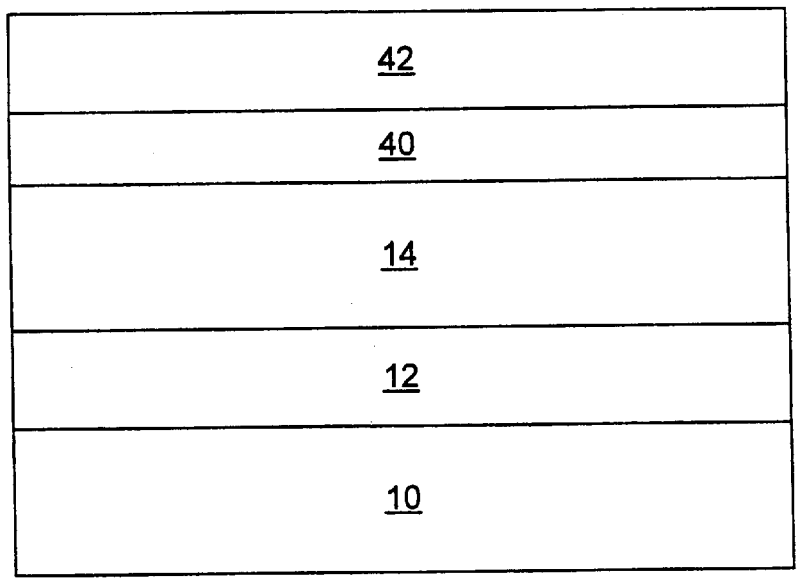
Figure 2D:
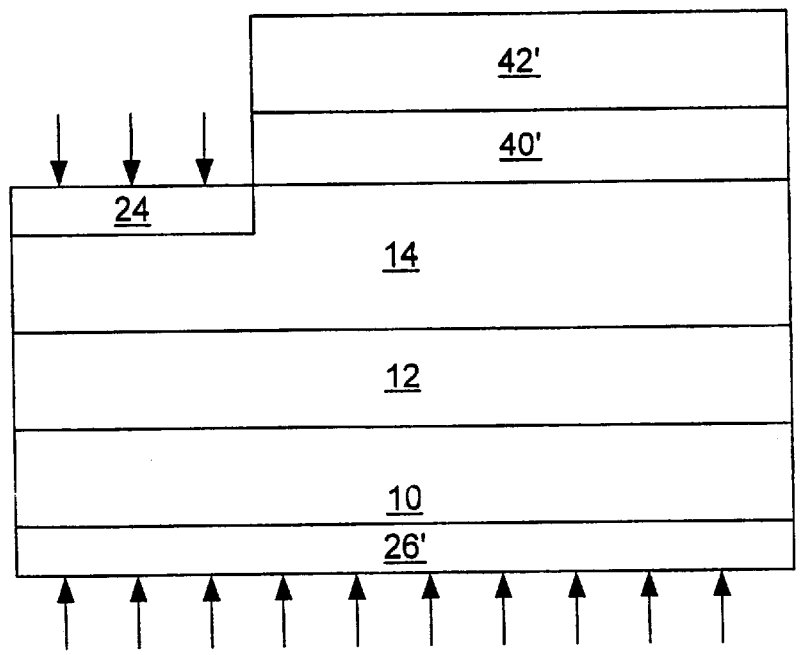

FIG. 2C and 2D illustrate optional processing steps for providing channel stop implants. As seen in FIG. 2C, a masking oxide 42 is formed on the p-type epitaxial layer 40. Such a masking oxide may be formed, for example, utilizing Plasma Enhanced Chemical Vapor Deposition (PECVD) of SiO₂. The p-type epitaxial layer 40 and the masking oxide 42 are then patterned so as to provide an oxide mask 42' and a patterned p-type layer 40' for implantation of the channel stop 24. Furthermore, the opposite surface of the substrate 10 may also be implanted with n-type dopants so as to provide an optional n+ layer 26' suitable n-type dopants may include Nitrogen and Phosphorous. The structure of FIG. 2D may then be annealed to activate the n-type implants. Optionally, such an anneal may be delayed and performed simultaneously with the thermal oxidation of the p-type layer 40' as described below. Techniques for implantation and activation of n-type dopants in SiC are known to those of skill in the art. In the event that one or more of the n-type implants are not incorporated in the device, then the implant and/or annealing step(s) may be omitted. However, it is preferred that the patterning of the p-type layer 40 still be carried out so as to define the outer periphery of the p-type epitaxial termination region 16.

Figure 2E:
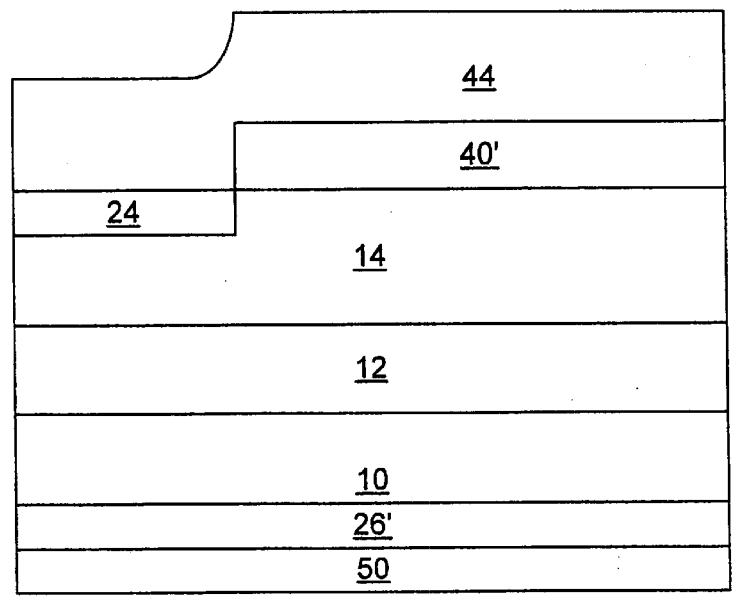

As is seen in FIG. 2E, after removal of the oxide mask 42', a passivating oxide layer 44 is formed on the exposed surface of at least the patterned p-type epitaxial layer 40', the n-type implanted region 24 (if present) and/or the n-type voltage blocking layer 14. If an n-type implant is also provided in the opposite face of the substrate, then an oxide layer 50 may also be deposited on the opposite side of the substrate 10 over the implanted region 26'. Such oxide layers may help to prevent loss of ion implanted regions during subsequent thermal oxidation steps. Preferably, the oxide layers 44 and 50 are deposited oxide layers and more preferably are Low Pressure Chemical Vapor Deposition (LPCVD) layers of SiO₂, however, high quality Plasma Enhanced Chemical Vapor Deposition 9PECVD) may also be used.

Figure 2F:
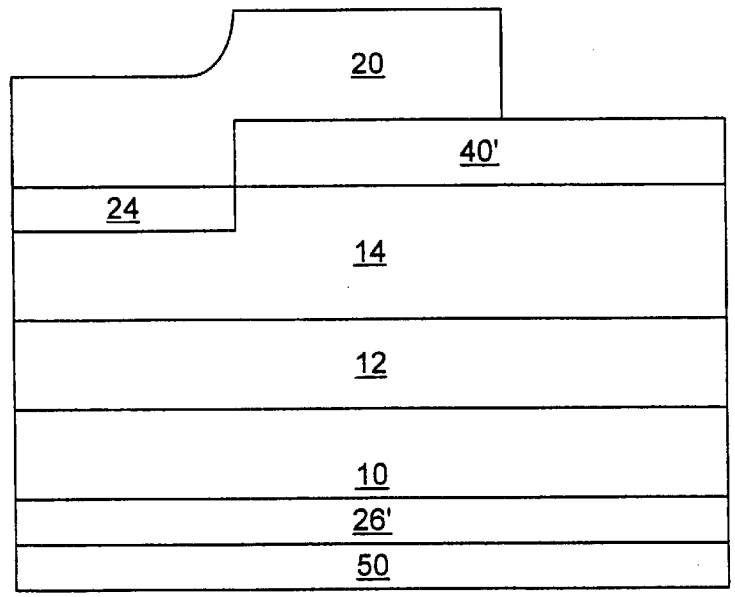
Figure 2G:
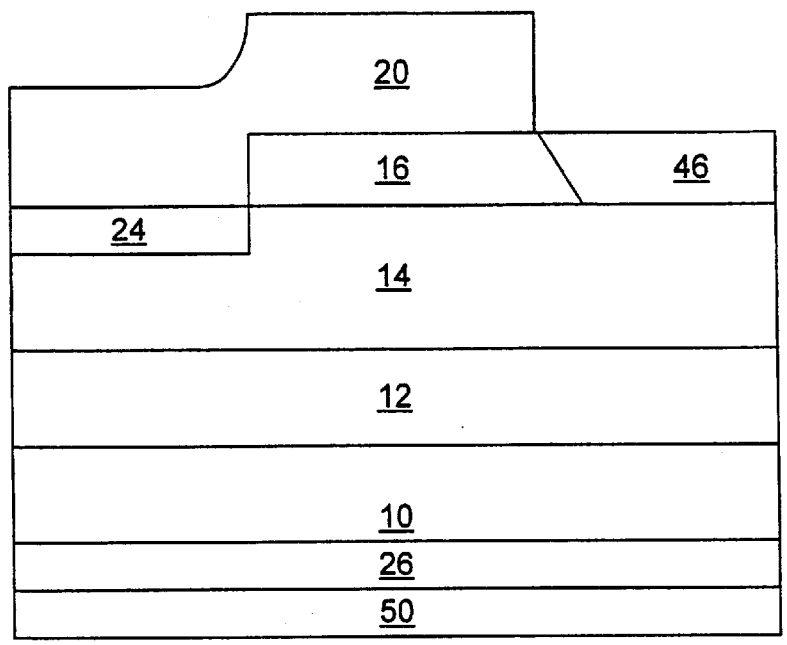

As illustrated in FIG. 2F, the oxide passivating layer 44 may be patterned to expose the p-type layer 40'. Such a patterning may be accomplished by photolithography and reactive ion etching, selective growth or other such techniques known to those of skill in the art. The oxide passivating layer 44 is preferably patterned so as to provide a window for formation of the Schottky contact so as to provide a passivating layer 20 on exposed portions of the final device other than the Schottky contact 18. The structure of FIG. 2F is thermally oxidized for a time sufficient to completely oxidize the exposed portion of the p-type layer 40' so as to provide a region of oxidized p-type SiC 46 corresponding to the Schottky contact location and the termination region 16 as is seen in FIG. 2G. Such a thermal oxidation is preferably carried out in a dry ambient of preferably less than about 1500 ° C. and more preferably about 1300 ° C. or less for a time sufficient to completely oxidize the p-type epitaxial layer 40'. The duration of such a thermal oxidation may vary depending on the temperature utilized and the thickness of the p-type epitaxial layer 40'. As described above, such thermal oxidation step may also be utilized to activate the n-type implants.

Figure 2H:
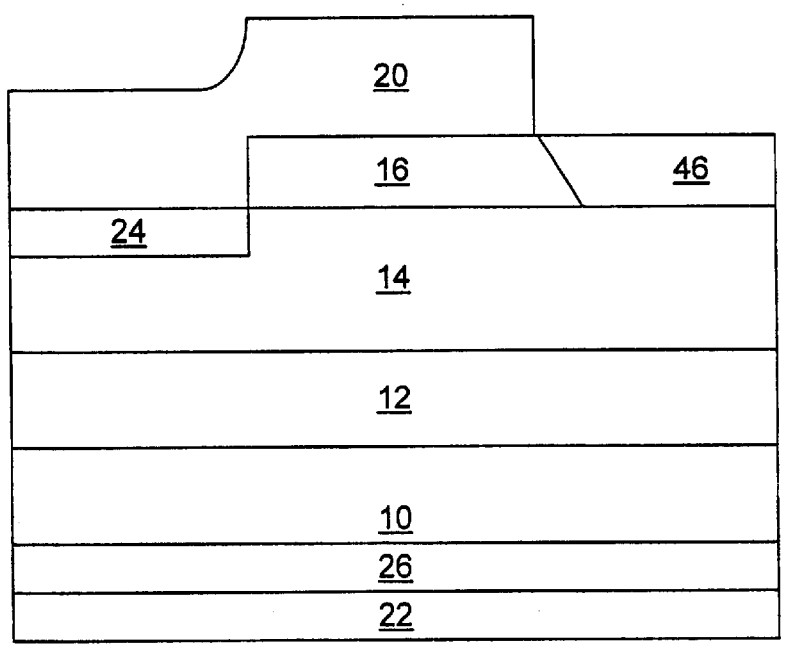

After the thermal oxidation is complete, the oxide layer 50 is removed from the opposite side of the substrate by, for example, reactive ion etching, and a metal layer deposited to provide an ohmic contact 22. Suitable materials for such an ohmic contact include Nickel or other such materials known to those of skill in the art. The metal layer is also annealed to form the ohmic contact 22. The anneal may be accomplished by a rapid thermal anneal process. Such operations are illustrated by FIG. 2H. After forming the ohmic contact 22, a photoresist pattern is deposited to provide a window for making the Schottky contact 18 and the thermal oxide etched through to the n-type epitaxial layer 14 so as to provide the window for forming the Schottky contact 18.

Figure 2I:
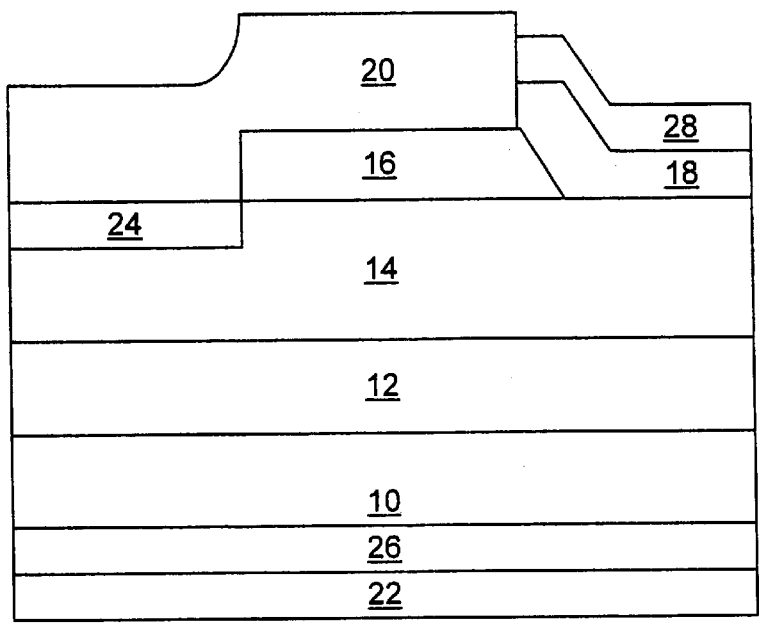

Such an etch of the oxide 46 may be accomplished by a buffered oxide etch. As seen in FIG. 2I, the Schottky metal is deposited in the window formed by the etching of the oxide region 46 and may slightly overlap the p-type termination region 16. The Schottky metal may be any suitable Schottky metal, such as Nickel, Chromium, Titanium or Platinum. Also, an optional metal overlayer 28 of, for example, gold, may be formed on the Schottky contact 18.

As illustrated in FIG. 2I, the Schottky contact 18 and the p-type edge termination region 16 form a non-ohmic contact. Such a non-ohmic contact may be characterized by a non-linear voltage/current relationship of the contact. In particular, the contact has a finite turn-on voltage and a reverse leakage current which is at least $10^3$ times smaller than the rated on-state current. A reverse blocking voltage is also exhibited which is primarily determined by the epitaxial layer (14) properties. In addition, this junction follows closely the thermionic current transport physics at room temperature.

Figure 4:
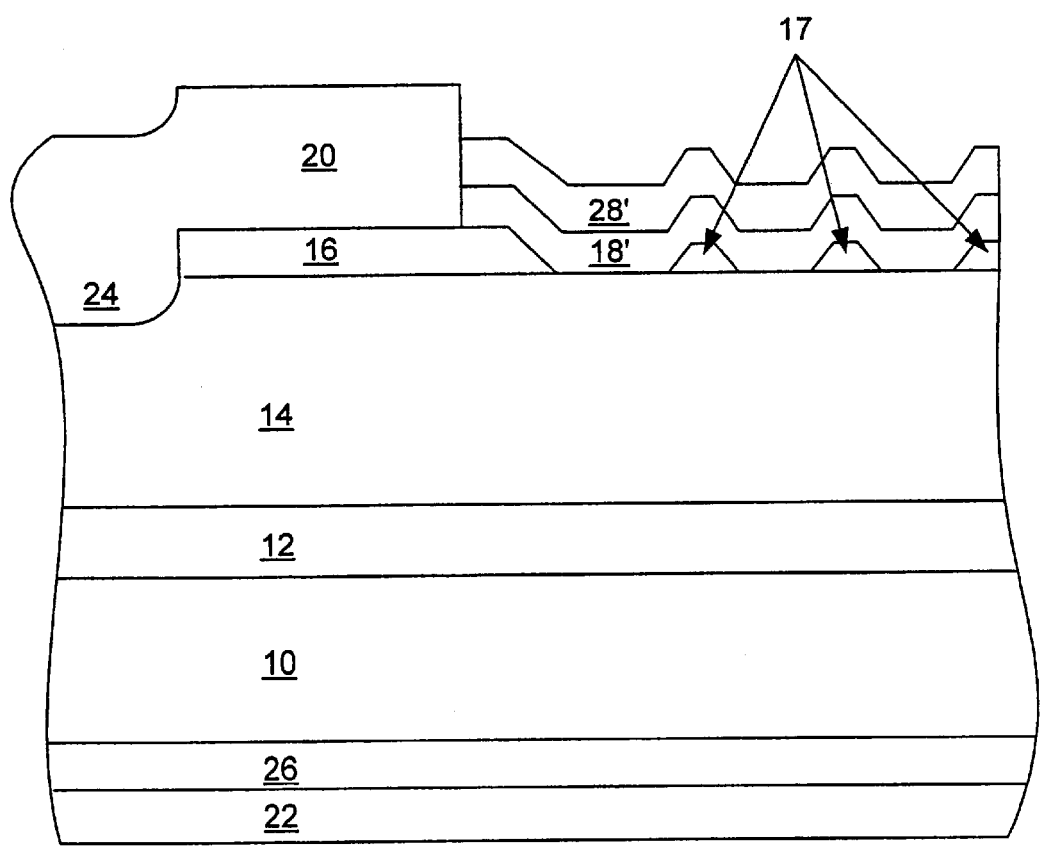
FIG. 4 is a cross-sectional view of a Schottky rectifier according to alternative embodiments of the present invention.

FIG. 4 illustrates a further embodiment of the present invention where a Junction Barrier Schottky (JBS)/Merged P-I-N Schottky (MPS) grid 17 is provided in the Schottky gate region. A Schottky contact 18' and metal overlayer 28' may be provided over the JBS/MPS grid 17. Such a grid may be provided by modifying the patterning of the passivating layer 44 so as to provide a mask for oxidation of the p-type epitaxial layer 40' which provides the "bump" or "islands" of the JBS/MPs gate structure illustrated in FIG. 4. The oxide on the grid 17 may be removed by mask and reactive ion etching. Additionally, the grid 17 may be masked when the thermally oxidized regions are etched away to provide the Schottky contact window.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a termination region of a silicon carbide Schottky rectifier, the method comprising:

forming an epitaxial layer of p-type silicon carbide having a thickness and a doping level selected so as to provide a charge in a region of p-type silicon carbide adjacent to a Schottky contact of the Schottky rectifier based on to the surface doping of a silicon carbide blocking layer of the Schottky rectifier; and patterning the epitaxial layer of p-type silicon carbide so as to provide the region of p-type silicon carbide adjacent to a Schottky contact of the Schottky rectifier.

2. A method according to claim 1, wherein the step of patterning the epitaxial layer of p-type silicon carbide comprises the steps of:

forming an oxide layer on the p-type epitaxial layer of silicon carbide;

patterning the oxide layer so as to expose a portion of the p-type epitaxial layer corresponding to the Schottky contact;

thermally oxidizing the exposed portion of the p-type epitaxial layer at a temperature and for a time sufficient to consume all of the exposed portion of the p-type epitaxial layer; and etching the thermally oxidized portion of the p-type epitaxial layer so as to expose a portion of the blocking layer on which the Schottky contact is formed.

3. A method according to claim 2, wherein the step of thermally oxidizing the p-type epitaxial layer is carried out in a dry ambient environment.

4. A method according to claim 2, wherein the step of the thermally oxidizing the p-type epitaxial layer comprises the step of oxidizing the p-type epitaxial layer at a temperature of less than about 1300 ° C.

5. A method according to claim 2, wherein the step of etching the thermally oxidized portion of the p-type epitaxial layer is preceded by the steps of:

forming an ohmic metal on a surface of a silicon carbide substrate opposite the blocking layer; and annealing the ohmic metal so as to form an ohmic contact to the silicon carbide substrate.

6. A method according to claim 5, wherein the step of depositing an ohmic metal is preceded by the step of implanting n-type dopants in the substrate so as to form a region of n-type silicon carbide having a carrier concentration higher than a carrier concentration of the substrate; and wherein the step of forming an ohmic metal comprises the step of depositing an ohmic metal on the implanted region of the substrate.

7. A method according to claim 6, wherein the step of implanting n-type dopants is carried out prior to the step of thermally oxidizing the exposed portion of the p-type epitaxial layer such that the step of thermally oxidizing the exposed portion of the p-type epitaxial layer also activates the n-type dopants.

8. A method according to claim 5, wherein the step of etching the thermally oxidized portion of the p-type epitaxial layer is followed by the step of depositing a Schottky metal on the exposed portion of the blocking layer.

9. A method according to claim 2, wherein the step of patterning the oxide layer so as to expose a portion of the p-type epitaxial layer corresponding to the Schottky contact further comprises patterning the oxide layer so as to expose a portion of the p-type epitaxial layer corresponding to the Schottky contact and provide a plurarity of regions of exposed portions of the p-type epitaxial layer;

thermally oxidizing the exposed portion of the p-type epitaxial layer including the plurality of regions at a temperature and for a time sufficient to consume all of the exposed portion of the p-type epitaxial layer; and etching the thermally oxidized portion of the p-type epitaxial layer so as to expose a portion of the blocking layer on which the Schottky contact is formed thereby providing a plurality of exposed portions of the blocking layer spaced apart by islands of p-type silicon carbide.

10. A method according to claim 1, wherein the step of patterning the oxide layer so as to expose a portion of the p-type epitaxial layer corresponding to the Schottky contact is preceded by the steps of:

patterning the oxide layer and the p-type epitaxial layer to expose a portion of the blocking layer at the periphery of the Schottky rectifier; and implanting n-type dopants in the exposed portion of the n-type blocking layer so as to provide a region of implanted n-type dopants adjacent the periphery of the p-type epitaxial layer.

11. A method according to claim 1, wherein the thickness and doping level of the silicon carbide epitaxial region are selected so as to provide charge in the region of p-type silicon carbide adjacent to a Schottky contact of the Schottky rectifier which is from about 50% to about 100% of $$\frac{(\varepsilon_r \times \varepsilon_0 \times E_C)}{q};$$

where:
 $\varepsilon_r$ is a relative dielectric constant of SiC;
 $\varepsilon_0$ is a dielectric constant of air;
 $E_C$ is a critical electric field of SiC; and
 q is an electronic charge.

12. A method according to claim 11, wherein the thickness and doping level provide a charge of about 75% of $$\frac{(\varepsilon_r \times \varepsilon_0 \times E_C)}{q}.$$

13. A method of fabricating a silicon carbide Schottky rectifier, the method comprising the steps of:
  forming a first n-type silicon carbide epitaxial layer on an n-type silicon carbide substrate, wherein the first n-type silicon carbide epitaxial layer has a carrier concentration less than a carrier concentration of the silicon carbide substrate;
  forming a p-type silicon carbide epitaxial layer on the first n-type epitaxial layer;
  forming a patterned passivating oxide on the p-type silicon carbide epitaxial layer to expose a portion of the p-type silicon carbide corresponding to a Schottky contact of the Schottky rectifier;
  thermally oxidizing the exposed portion of the p-type silicon carbide to oxidize the p-type silicon carbide to the first n-type epitaxial layer; then
  depositing and annealing an ohmic contact metal on the substrate opposite the first n-type epitaxial layer so as to provide an ohmic contact to the substrate; then
  removing the oxidized p-type silicon carbide to expose a portion of the first n-type epitaxial layer corresponding to the Schottky contact; and
  forming a Schottky metal on the exposed portion of the first n-type epitaxial layer so as to provide a Schottky contact to the first n-type epitaxial layer.

14. A method according to claim 13, wherein the type silicon carbide epitaxial layer has a thickness and a doping level selected so as to provide a charge in a region of p-type silicon carbide adjacent to the Schottky contact of the Schottky rectifier based on the surface doping of the first n-type epitaxial layer.

15. A method according to claim 13, further composing the step of forming a second layer of n-type silicon carbide, wherein the second layer of n-type silicon carbide is disposed between the silicon carbide substrate and the first n-type epitaxial layer and has a carrier concentration comparable to the carrier concentration the silicon carbide substrate.

16. A method according to claim 13, further comprising the steps of:
  patterning the p-type epitaxial layer to expose a portion of the first n-type epitaxial layer adjacent the periphery of the Schottky rectifier;
  implanting n-type dopants in the exposed portion of the first n-type epitaxial layer;
  thermally annealing the implanted dopants so as to activate the n-type dopants; and
  wherein the step of depositing a passivating oxide comprises depositing a passivating oxide on the p-type epitaxial layer and the implanted region of the first n-type epitaxial layer.

17. A method according to claim 16, wherein the thermal anneal of the implanted dopants is carried out at a temperature of less than about 1300° C.

18. A method according to claim 16, further comprising the step of implanting n-type dopants in the silicon carbide substrate opposite the first n-type epitaxial layer so as to provide a region of n-type silicon carbide having a carrier concentration comparable to the carrier concentration of the silicon carbide substrate.

19. A method according to claim 10, wherein the step of implanting n-type dopants is followed by the step of depositing an oxide on the implanted region of the silicon carbide substrate; and
  wherein the step of thermally oxidizing is followed by the step of removing the oxide from the implanted region of the silicon carbide substrate.

* * * * *

UNITED STATES PATENT AND TRADEMARK OFFICE
CERTIFICATE OF CORRECTION

PATENT NO. : 6,673,662 B2
DATED : January 6, 2004
INVENTOR(S) : Singh

It is certified that error appears in the above-identified patent and that said Letters Patent is hereby corrected as shown below:

Title page,
Item [56] References Cited, OTHER PUBLICATIONS should include

-- Appels et al. reference "High-voltage thin layer devices (RESURF devices)," *IEDM Tech. Dig.*, 1979, pp. 238-41. Li et al. reference "Theoretical and Experimental Study of 4H-SiC Junction Edge Termination," *Materials Science Forum*, Vols. 338-342 (2000), pp. 1375-8.
Merchant et al. reference, "Realization of High Breakdown Voltage (>700V) in Thin SOI Devices," *Tech. Digest of ISPS'91*, pp. 31-4.
Yilmaz, Hamza reference, "Optimization and Surface Charge Sensitivity of High Voltage Blocking Structures with Shallow Junctions," *IEEE Transactions on Electron Devices*, Vol. 38, No. 3, July 1991, pp. 1665-75. --

Column 13,
Line 45, should read -- 14. A method according to claim 13, wherein the p-type --

Signed and Sealed this

Fifth Day of October, 2004

JON W. DUDAS
*Director of the United States Patent and Trademark Office*